United States Patent [19]

Kasukawa et al.

[11] Patent Number: 5,325,385
[45] Date of Patent: Jun. 28, 1994

[54] BURIED-TYPE SEMICONDUCTOR LASER DEVICE

[75] Inventors: Akihiko Kasukawa, Tokyo; Toshio Kikuta, Fujisawa, both of Japan

[73] Assignee: The Furukawa Electric Co., Ltd., Tokyo, Japan

[21] Appl. No.: 991,944

[22] Filed: Dec. 17, 1992

[30] Foreign Application Priority Data

Dec. 18, 1991 [JP] Japan .................. 3-353614

[51] Int. Cl.$^5$ .............................................. H01S 3/19
[52] U.S. Cl. ...................................... 372/46; 372/45
[58] Field of Search ................................ 372/46, 45

[56] References Cited

U.S. PATENT DOCUMENTS 4,984,244  1/1991  Yamamoto et al. ................. 372/46

FOREIGN PATENT DOCUMENTS 0111388  7/1983  Japan ................................. 372/46
0092684  5/1985  Japan ................................. 372/46

*Primary Examiner*—Georgia Y. Epps
*Attorney, Agent, or Firm*—Jacobson, Price, Holman & Stern

[57] ABSTRACT

This invention provides a buried-type semiconductor laser device that operates stably and reliably at a high temperature for a prolonged period of time. A buried-type semiconductor laser device according to the invention comprises a semiconductor substrate 2, a first ridge mesa 8 formed on said substrate 2, said first ridge mesa 8 being covered on the top with at least an active layer 4 and provided at both lateral edges with current blocking layers 9, 10 of p-n reverse junction semiconductors arranged along the active layer for confining electric currents, and a second ridge mesa 11 formed by said first ridge mesa 8 and said current blocking layers 9, 10 and provided at both lateral edges with a semi-insulating layer 13.

7 Claims, 2 Drawing Sheets

BURIED-TYPE SEMICONDUCTOR LASER DEVICE

BACKGROUND OF THE INVENTION

1. Field of the Invention

This invention relates to an improvement on a buried-type semiconductor laser device to be used as a light source in an optical telecommunication system.

2. Prior Art

A semiconductor laser device to be used as a light source in an optical telecommunication system is required to have various functional features such as a high output power and a low threshold current, and a high speed modulation capability.

A buried-type semiconductor laser device (having a BH structure) is known to meet such requirements.

FIG. 2 of the accompanying drawings illustrates a typical known buried-type semiconductor laser device.

Referring to FIG. 2, the buried-type semiconductor laser device 14 comprises an n-InP semiconductor substrate 15, on which an n-InP buffer layer 16, a nondoped GaInAsP active layer 17 (having an energy band gap wavelength of 1.3 μm), InP clad layers 18 and 19 and a GaInAs contact layer 20 are sequentially formed by means of an epitaxial growth technique such as the MOCVD method to bring forth a multilayer structure.

Additionally, p-InP current blocking layers 21 and n-InP current blocking layers 22 extends from the respective upper edges of the clad layer 18 to cover the etched areas of the buffer layer 16 and then grooves 23 are cut through the current blocking layers 21 and 22, the clad layer 19 and the contact layer 20 in order to reduce the device capacity. The grooves 23 and part of the segmented contact layer are covered by an $SiO_2$ insulating film 24.

3. Problem to be Solved by the Invention

A buried-type semiconductor laser device 14 having a configuration as illustrated in FIG. 2 is subject to internal stresses (distortions) particularly in the active layer 17 which is particularly remarkable at high temperature due to the significant difference in the thermal expansion coefficient between and the close physical proximity of the insulating films 24 covering the surface of the grooves 23 and the active layer 17.

A semiconductor laser device 14 which is subject to such distortions cannot reliably operate for a long period of time.

4. Object of the Invention

In view of the above identified technological problem, it is therefore an object of the present invention to provide a buried-type semiconductor laser device that operates stably and reliably at high temperature for a prolonged period of time.

SUMMARY OF THE INVENTION

According to the invention, the above object is achieved by providing a buried-type semiconductor laser device comprising a semiconductor substrate, a first ridge mesa formed on said substrate, said first ridge mesa being covered on the top with at least an active layer and provided at both lateral edges with a current blocking layers of p-n reverse junction semiconductors arranged along the active layer for confining electric currents, and a second ridge mesa formed by said first ridge mesa and said current blocking layers and provided at both lateral edges with a semi-insulating layer.

Said active layer preferably has a bulk structure, a quantum well structure or a strained quantum well structure.

Said active layer formed on said first ridge mesa is preferably covered with a clad layer.

Said second ridge mesa formed by said first ridge mesa and said current blocking layers may additionally comprise clad and contact layers.

Said current blocking layers may be made of n-InP and p-InP and said semi-insulating layer may be made of Fe doped InP or polyimide and covered with an InP layer.

FUNCTION

A buried-type semiconductor laser device according to the invention can effectively confine injection currents by its current blocking layers of p-n reverse junction semiconductors and therefore shows a low threshold current for laser oscillation and a reduced capacity of the device due to the arrangement of a semi-insulating layer.

More specifically, since a buried-type semiconductor laser device according to the invention does not have grooves in the close proximity of an active layer and insulating films covering the grooves (and having a thermal expansion coefficient different from that of the active layer), it is practically free from internal stresses and distortions even if it is driven at a high temperature.

Thus, a buried-type semiconductor laser device according to the invention operates stably and reliably for a prolonged period of time, if it is driven at a high temperature.

DETAILED DESCRIPTION OF THE INVENTION

Now, the present invention will be described in greater detail by referring to FIG. 1 of the accompanying drawings that illustrates a preferred embodiment of the invention.

Figure 1:
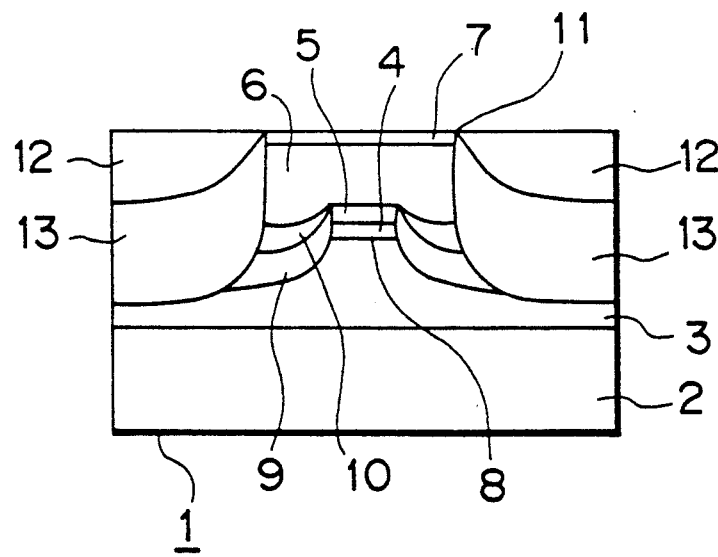
FIG. 1 is a sectional view of a preferred embodiment of buried-type semiconductor laser device of the invention.

In FIG. 1, the buried-type semiconductor laser device 1 comprises an n-InP semiconductor substrate 2, on which an n-InP buffer layer 3, a nondoped GaInAsP active layer having an energy band gap wavelength of 1.3 μm, a p-InP clad layer 5, a p-InP clad layer 6, a p-GaInAs contact layer 7, a p-InP current blocking layer 9, an n-InP current blocking layer 10, an n-InP layer 12 and a semi-insulating layer 13 are sequentially formed to bring forth a multilayer structure and is provided with a first ridge mesa 8 and a second ridge mesa 11.

In a semiconductor laser device 1 having a configuration as described above, the semiconductor substrate 2 typically may have a thickness of 350 m and the buffer layer 3, the active layer 4 and the clad layer 5 may respectively have thicknesses of 1 μm, 0.1 μm and 0.5 μm, while the clad layer 6, the contact layer 7 and the current blocking layer 9 may respectively have thicknesses of 2 μm, 0.3 μm and 2 μm and the thickness of the current blocking layer 10, the n-InP layer 12 and the semi-insulating layer 13 may respectively be 1 μm, 0.7 μm and 3 μm, although the above figures are cited only as examples and the present invention is not limited thereto.

The semi-insulating layer 13 may alternatively be made of polyimide and, while the active layer 4 of this embodiment has a bulk structure, it may alternatively have a different structure such as a quantum well structure or a strained quantum well structure.

Since a semiconductor laser device 1 as described above is subjected to current confinement to be realized by the current blocking layers 9 and 10, involving a p-n reverse junction, it can be driven by a low threshold current and the capacity of the device 1 is reduced by the existence of segmented semi-insulating layer 13 disposed at the lateral sides of the second ridge mesa 11.

What is more, the device 1 maintains its reliability because its active layer 4 is practically free from stress, if the device 1 is used at a high temperature for a prolong period of time.

Figure 2:
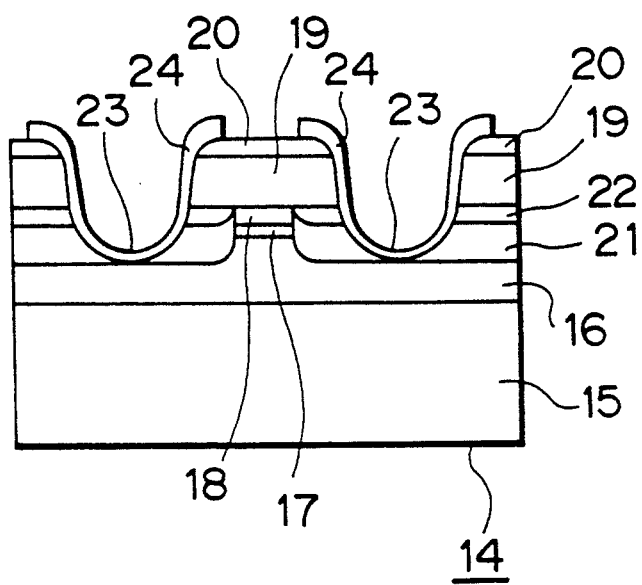
FIG. 2 is a sectional view of a conventional buried-type semiconductor laser device.

The reason why the active layer 4 is immune to stress is that the device 1 of the invention does not have any grooves which are covered by an insulating film having a thermal expansion coefficient significantly different from that of the active layer and located in the proximity of the active layer as in the case of a conventional device described above by referring to FIG. 2.

A buried-type semiconductor laser device 1 according to the invention and illustrated in FIG. 1 can be prepared by way of a manufacturing process as described below.

In the first step, a buffer layer 3, an active layer 4 and a clad layer 5 are formed on an n-InP semiconductor substrate 2 by a first application of an epitaxial growth technique (MOCVD method).

Then, in the second step, the surface of the clad layer 5 is masked along a center line for a width of approximately 1.5 μm and the layers from the clad layer 5 down to the buffer layer 3 are etched by a first application of a (known) photolithography technique to produce a first ridge mesa 8.

Thereafter, in the third step, the surface of the active layer is masked by SiO2 and a current blocking layer 9 is formed in segments on the areas that have been etched for the first time.

Then, segments of another current blocking layer 10 are selectively made to grow on the respective segments of the current blocking layer 9 until they reach the height of the surface of the active layer 4.

After removing the SiO2 mask, in the fourth step, a clad layer 6 and a contact layer 7 are sequentially formed on the active layer 4 and the current blocking layer 10 by a second application of an epitaxial growth technique.

Subsequently, in the fifth step, the surface of the contact layer 7 is masked along a center line for a width of approximately 5 to 20 μm and then the layers from the contact layer 7 down to the buffer layer 3 are etched by a second application of a photolithography technique to produce a second ridge mesa 11.

Then, in the sixth step, a semi-insulating layer 13 and an InP layer 12 are sequentially formed in segments on the second etched areas by means of an epitaxial growth technique to produce a buried-type semiconductor laser device 1.

Finally, in the seventh step, the SiO2 mask is removed from the buried-type semiconductor laser device 1 and p- and n-electrodes are formed.

The above described sixth step may alternatively be inserted after the third step.

If the semi-insulating layer 13 is made of polyimide, the operation of successively growing layers by means of an epitaxial growth technique will be omitted.

ADVANTAGE OF THE INVENTION

As is apparent from the above description, a buried-type semiconductor laser device according to the invention operates stably and reliably at a high temperature for a prolonged period of time, because it is free from distortions in its active layer due to stresses that may arise when it is driven at a high temperature.

What is claimed is:

1. In a buried-type semiconductor laser device comprising a semiconductor substrate, a first ridge mesa formed on said substrate, said first ridge mesa being covered on top with an active layer and provided at both lateral edges with current blocking layers of p-n reverse junction semiconductors arranged along the active layer for confining injection currents, and a second ridge mesa formed at least by said first ridge mesa and said current blocking layers and provided at both lateral edges with a semi-insulating layer.

2. A buried-type semiconductor laser device according to claim 1, wherein said active layer has a bulk structure, a quantum well structure or a strained quantum well structure.

3. A buried-type semiconductor laser device according to claim 1, wherein said active layer formed on said first ridge mesa is covered with a clad layer.

4. A buried-type semiconductor laser device according to claim 1, wherein said second ridge mesa formed by said first ridge mesa and said current blocking layers comprises clad and contact layers.

5. A buried-type semiconductor laser device according to claim 1, wherein said current blocking layers are made of n-InP and p-InP.

6. A buried-type semiconductor laser device according to claim 1, wherein said semi-insulating layer is made of Fe-doped InP and covered with an InP layer or the semi-insulating layer is made of polyimide.

7. A buried-type semiconductor laser device according to claim 5, wherein an InP layer is formed on said semi-insulating layer.

* * * * *